US010076041B2

(12) United States Patent
Sugihara et al.

(10) Patent No.: US 10,076,041 B2
(45) Date of Patent: Sep. 11, 2018

(54) SOLDERING DEVICE

(71) Applicant: Senju Metal Industry Co., Ltd., Tokyo (JP)

(72) Inventors: Takashi Sugihara, Tokyo (JP); Hiroshi Taguchi, Tokyo (JP); Tsutomu Hiyama, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/517,762

(22) PCT Filed: Oct. 7, 2015

(86) PCT No.: PCT/JP2015/078460
§ 371 (c)(1),
(2) Date: Apr. 7, 2017

(87) PCT Pub. No.: WO2016/056583
PCT Pub. Date: Apr. 14, 2016

(65) Prior Publication Data
US 2017/0311453 A1    Oct. 26, 2017

(30) Foreign Application Priority Data

Oct. 9, 2014  (JP) .................................. 2014-208349

(51) Int. Cl.
*B23K 37/00* (2006.01)
*H05K 3/34* (2006.01)
(Continued)

(52) U.S. Cl.
CPC ................. *H05K 3/34* (2013.01); *B23K 1/08* (2013.01); *B23K 3/06* (2013.01); *B23K 3/0676* (2013.01);
(Continued)

(58) Field of Classification Search
CPC .......... H05K 3/34; B23Q 1/265; F16H 25/24; B23K 1/00–1/206; B23K 3/00–3/087; B23K 37/04–37/0538
(Continued)

(56) References Cited

U.S. PATENT DOCUMENTS 4,369,957 A * 1/1983 Williams ........... B23K 37/0426
                                                          269/156
5,082,165 A * 1/1992 Ishizuka ................ B65G 25/02
                                                          228/179.1
(Continued)

FOREIGN PATENT DOCUMENTS

CN      102691711 A    9/2012
CN      202579566 U   12/2012
(Continued)

OTHER PUBLICATIONS

Machine translation of CN103121134A (no date available).*

*Primary Examiner* — Kiley Stoner
(74) *Attorney, Agent, or Firm* — The Webb Law Firm (57) ABSTRACT

Provided are a nut, an attachment for nut and a screw shaft, which are fitted to a coating material coating device or a soldering device and can change a fixed position of the nut easier than that of a convention example even if any adhered matters generated when each device is used for a long time are fixed, and a soldering device using the same. The nut 10 screws on to the screw shaft 2 having a predetermined length. The nut 10 is provided with a non-meshing part 11 composed of a notch 12 that is formed parallel to a movement direction thereof by cutting off screw threads and a flange portion 13, which has connecting holes 14 for connecting another member. Under such a configuration, by forward and/or backward movement of the nut 10, the notch 12 functions as if it scraps the fixed matters 6.

1 Claim, 9 Drawing Sheets

(51) Int. Cl.
*F16H 25/24* (2006.01)
*B23K 1/08* (2006.01)
*B23Q 1/26* (2006.01)
*B23K 3/08* (2006.01)
*B23K 3/06* (2006.01)

(52) U.S. Cl.
CPC ............... *B23K 3/08* (2013.01); *B23Q 1/265* (2013.01); *F16H 25/24* (2013.01)

(58) Field of Classification Search
USPC .......... 228/179.1–180.22, 33–43, 44.3–44.7, 228/47.1, 49.1, 49.4, 49.5
See application file for complete search history.

(56) References Cited

U.S. PATENT DOCUMENTS

| | | | | |
|---|---|---|---|---|
| 5,242,096 | A * | 9/1993 | Tsunabuchi | B23K 1/008 228/212 |
| 5,540,376 | A * | 7/1996 | Asla | B23K 3/0676 228/37 |
| 5,739,443 | A * | 4/1998 | Saunders | G01D 11/30 374/208 |
| 5,815,912 | A * | 10/1998 | Willshere | B23K 3/08 29/721 |
| 5,899,687 | A * | 5/1999 | Yu | B23K 3/0676 432/121 |
| 6,032,788 | A * | 3/2000 | Smithers | H05K 13/0069 198/817 |
| 6,182,819 | B1 * | 2/2001 | Rehm | A47B 57/26 198/803.11 |
| 6,276,225 | B1 | 8/2001 | Takeda et al. | |
| 6,908,270 | B1 | 6/2005 | Iwata | |
| 8,707,550 | B2 * | 4/2014 | Song | H01L 24/85 228/180.5 |
| 2008/0087178 | A1 * | 4/2008 | Jo | H05K 3/1216 101/129 |
| 2011/0278348 | A1 * | 11/2011 | Sugihara | B23K 1/0016 228/33 |
| 2013/0228611 | A1 * | 9/2013 | Byars | H01L 24/75 228/1.1 |
| 2016/0278217 | A1 * | 9/2016 | Tanaka | B23K 3/0653 |
| 2016/0278251 | A1 * | 9/2016 | Tanaka | H05K 13/0465 |
| 2016/0279743 | A1 * | 9/2016 | Surasing | H05K 3/3494 |
| 2017/0106481 | A1 * | 4/2017 | Henley | B23K 37/0533 |
| 2017/0209949 | A1 * | 7/2017 | Colijn | B23K 1/085 |

FOREIGN PATENT DOCUMENTS

| | | |
|---|---|---|
| CN | 103121134 A | 5/2013 |
| CN | 203441922 U | 2/2014 |
| JP | 4891379 | 11/1973 |
| JP | 55147517 | 10/1980 |
| JP | 61146611 U | 9/1986 |
| JP | 6280009 U | 5/1987 |
| JP | 6327712 U | 2/1988 |
| JP | 6464747 A | 3/1989 |
| JP | 653644 A | 2/1994 |
| JP | 6198428 A | 7/1994 |
| JP | 1162938 A | 3/1999 |
| JP | 2000145915 A | 5/2000 |
| JP | 200127215 A | 1/2001 |
| JP | 200144619 A | 2/2001 |
| JP | 200165663 A | 3/2001 |
| JP | 2002240920 A | 8/2002 |
| JP | 2008291924 A | 12/2008 |

\* cited by examiner

SOLDERING DEVICE

CROSS-REFERENCE TO RELATED APPLICATIONS

This application is the United States national phase of International Application No. PCT/JP2015/078460 filed Oct. 7, 2015, and claims priority to Japanese Patent Application No. 2014-208349 filed Oct. 9, 2014, the disclosures of which are hereby incorporated in their entirety by reference.

TECHNICAL FIELD

The present invention relates to a soldering device or the like such as a reflow device, a jet soldering device or the like in which flux is utilized when mounting electronic components on a printed circuit board. It specifically relates to a soldering device using a nut, which does not hinder a screw shaft from revolving even when a part of the flux evaporated by the soldering is adhered and fixed to the screw shaft or the like.

BACKGROUND TECHNOLOGY

When soldering electronic components on a printed circuit board, a soldering device such as a reflow device, a jet soldering device or the like has been generally used. For example, the reflow device is provided with conveyers that convey the printed circuit board and a reflow device body to which the conveyers convey the board. An interior of the reflow device body is respectively split into a preliminary heating zone, a heating zone and a cooling zone. In the pre-heating zone and the heating zone, heaters, fans, motors for driving the fans and the like are set and in the cooling zone, cooling members, cooling fans, motors for driving the cooling fans and the like are set.

In the soldering process of the reflow device, the board which has been previously printed by the solder paste is conveyed into the reflow device. The solder paste by which the board is printed contains solder powders and the flux. The flux is obtained by dissolving solid contents such as rosin, a thixotropy agent, an activator and the like with a solvent and has an effect to remove an oxide film from a surface of metal to be soldered and to prevent reoxidation by heating at the soldering, thereby lowering surface tension of the solder to improve wettability thereof.

In the above-mentioned heating step, the flux evaporates according to the heat by heater(s) and an interior of the reflow device is filled with it. The flux thus evaporated and filled into the reflow device body is generally withdrawn and clarified through a removal device for the flux component which is arranged outside a maffle and then, it is again circulated into the maffle via a circulating circuit.

More in detail, the solder paste applied to the printed circuit board becomes flux fume by vaporizing (or evaporating) the flux component, particularly, a solvent in the preliminary heating zone. Any solid component such as rosin in the flux component melted in the preliminary heating zone, when exposed to high temperature in the heating zone, also evaporates to become fumes which float in the device (maffle). The fumes derived from these solvent and solid component are cooled and condensed when they contact relative low temperature portions, for example, conveyors for conveying the printed circuit board, fans for circulating hot air, a frame constituting the device, a labyrinth arranged in an entrance and exit or the like, in the maffle during the withdrawing step. They become solid having adhesion when they are further cooled. Any problems occur when a large amount of solid fumes, so-called fume solids is applied to each component constituting the reflow furnace.

For example, a part of the evaporated flux fumes is adhered to a surface of a member (screw shaft, nut or the like) for adjusting conveying rails for conveying the printed circuit board to be a width between the rails matching a size of the board and it becomes liquid flux fumes with flowability accompanied by reduced temperature. The liquid flux fumes are soon solidified. Since the solidified flux fumes are hard to be removed and are strongly adhered, it is not easily possible to remove them by revolving the screw shaft. Accordingly, a movement of the nut is difficult so that it is very difficult to adjust the width of the rails.

In the jet soldering device, the soldering process is performed by jetting molten solder contained in a solder bath to a surface of the printed circuit board to which the flux has been previously applied. The flux components heated by the solder layer, however, evaporate, so that the problem in the above-mentioned reflow device also occurs in the jet soldering device. In addition, even when any adhered matters are fixed to at least any one of the nut and the screw shaft other than the soldering device, any similar problems occur such that these fixed matters are not easily removed by the revolving the screw shaft.

DOCUMENTS FOR PRIOR ART

Patent Documents

Patent Document 1: Japanese Patent Application Publication No. H06-053644

SUMMARY OF THE INVENTION

Problems to be Solved by the Invention

However, in case of exemplifying a soldering device, although the above-mentioned patent document 1 discloses a soldering device which includes rails for conveying a substrate that are adjustable to a width of mounted board and are applicable to a flow soldering device, a reflow soldering device or the like, this soldering device has taken no measure to the above problems. In addition, when any adhered matters are fixed to the screw shaft other than the soldering device, it has taken no measure to the above problems.

Thus, the present invention solves such problems and has an object to remove any flux fumes which are attached and solidified to members (screw shaft and nut) for adjusting a width between the rails to match a size of a substrate in the soldering device. In addition, when any adhered matters are fixed to the screw shaft, it also similarly has an object to remove any adhered matters fixed to the screw shaft.

Means for Solving the Problems

The technical means of this invention taken for solving the above-mentioned problems are as follows.

(1) A soldering device includes an adjustment member for changing a width between conveying rails to match a size of a conveying substrate to be soldered, wherein the adjustment member includes a screw shaft that rotates, a nut having a flange portion for connection, a fixed position of the nut to the screw shaft being changeable forward or backward by rotating the screw shaft, and a rail-supporting member for supporting a rail which conveys the substrate, the rail-supporting member being fixed to the nut through the flange portion for connection and changing the width between the conveying rails to match the size of the conveying substrate, wherein the nut contains a screw portion from a forward end thereof to a rear end thereof and includes at least one non-meshing part along whole thereof, the non-meshing part does not meshing with the screw shaft, and wherein when changing the width between the rails for conveying the substrate by rotating, the screw shaft, an adhered matter which is adhered to the screw shaft and is fixed thereto is scrapped by a ridge of the non-meshing part due to the rotation of the screw shaft.

Effects of the Invention

By the nut used for this invention, it is possible to strip the adhered matter by a function of the non-meshing part even when the adhered matter is fixed to the screw shaft screwed onto the nut. Since the non-meshing part strips off or scraps the adhered matter without fixing the matter stripped by the nut to another screw shaft (valley of screw) again, it stops the prevention of the revolution of the screw shaft by the stripped adhered matter (scrapped matter) so that the screw shaft smoothly rotates. As a result thereof, it is possible to change (adjust) a fixed position of the nut easier that the conventional case.

By the soldering device according to the invention, since any flux fumes which are adhered and solidified to the members (screw shaft and nut) for adjusting a width between the rails to match a size of a substrate in the soldering device are removed while they are scrapped, a forward or backward movement of the nut to the screw shaft becomes easy so that it is easily possible to change the fixed position of the nut. Accordingly, it is easily possible to remove the flux adhered to the members (screw shaft and nut) for adjusting the width between the rails to match the size of the substrate.

When applying the nut used for the invention and the screw shaft screwed onto the nut to a reflow device, it is easily possible to adjust a width between the rails for conveying the printed circuit board to match the size of the board. Since the adhered flux is able to be easily removed, it is possible to reduce time and costs required for maintenance of the soldering device.

EMBODIMENT FOR CARRYING OUT THE INVENTION

The following will describe a soldering device as an embodiment according to the invention with reference to the drawings.

First Embodiment

Figure 1A:
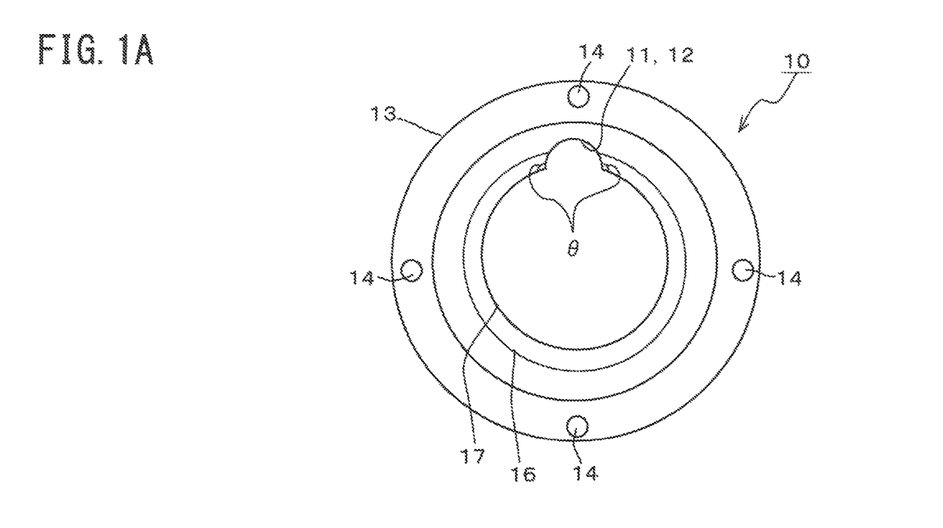
FIG. 1A is a plan view of a nut 10 for showing a configuration example thereof as a first embodiment.

A configuration example and a variation example of a nut 10 will be described with reference FIGS. 1A through 3B. The nut 10 shown in FIGS. 1A and 1B screws on to a screw shaft 2 having a predetermined length (see FIG. 4) and is able to change the fixed position of the nut 10 to the screw shaft 2. In FIG. 1A, a narrow line circle indicates a valley 16 of screw in the nut 10. A bold line circle indicates a screw thread 17 of the nut 10.

Figure 1B:
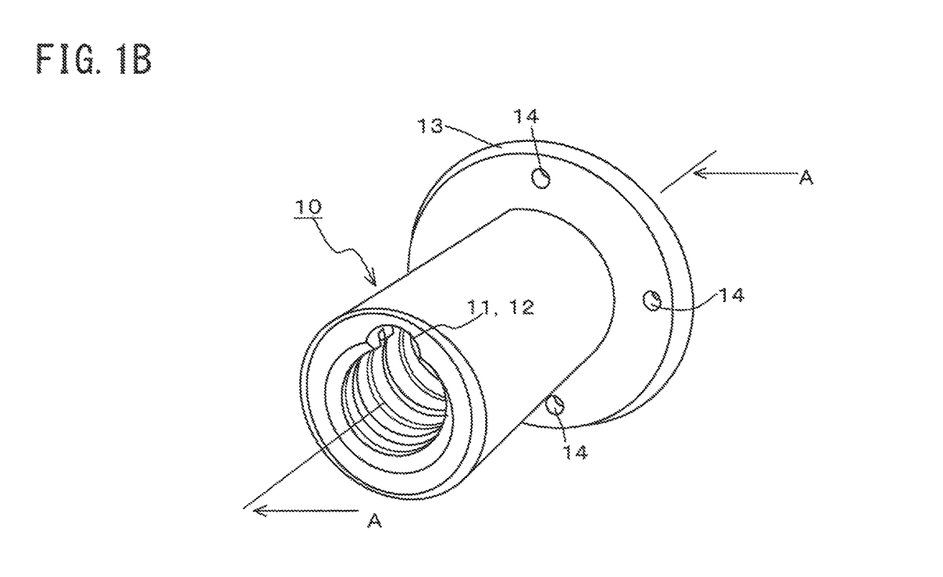
FIG. 1B is a perspective view of the nut 10 for showing the configuration example thereof.

The nut 10 shown in FIG. 1B includes one non-meshing part 11 which does not mesh with the screw shaft 2 and a flange portion 13 for connecting another member at a screw head of the nut 10. The non-meshing part 11 includes a notch 12 that is formed by cutting off a part of the screw head of the nut 10 in an arc-like shape. The flange portion 13 contains four connecting holes 14 in this embodiment for allowing it to be connected to another member by screws or the like.

A shape of the notch 12 is not limited to an arc-like shape. It is preferable that a cut depth of the notch is deeper than the valley of screw in the nut 10. A diameter (width) of the notch 12 is not limited. An angle θ formed by the screw thread 17 and the notch 12 (see FIG. 1A) is not limited but 90 degrees is preferable. In a case where 90 degrees are selected, its processing is also easier and it is possible to efficiently strip any adhered matters, which will be described later, by the notch 12 even when they are more firmly adhered.

Figure 2:
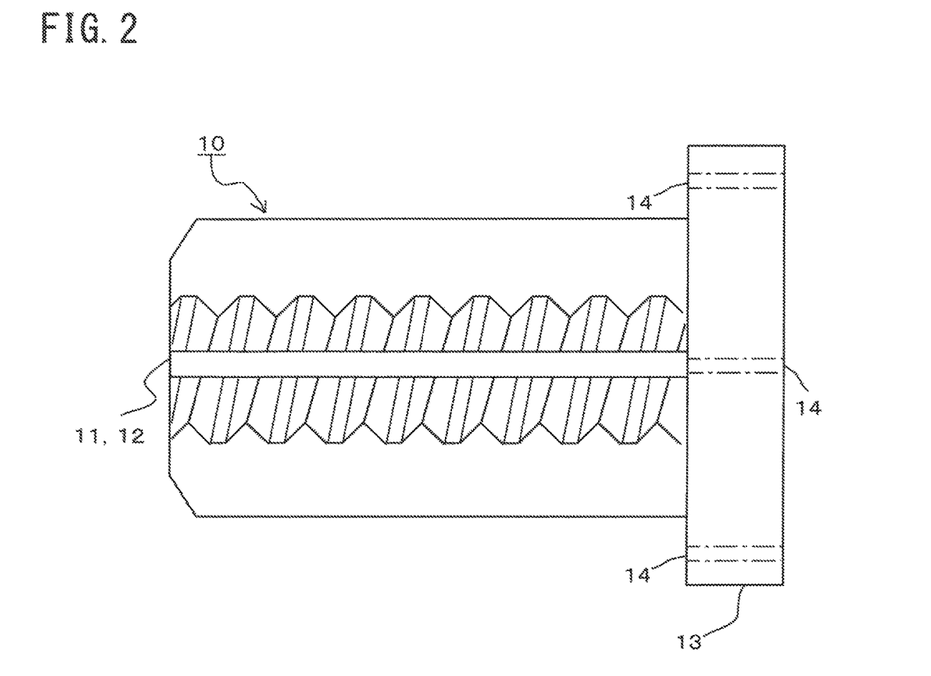
FIG. 2 is a cross-sectional view of the nut 10, taken along lines A-A.

The notch 12 shown in FIG. 2 is arranged parallel to a movement direction with regards to the screw shaft 2, not shown in this drawing, of the nut 10 at a whole length (whole) from a forward end of the nut 10 to a rear end thereof. Although one notch 12 has been arranged in the not 10, the number of the notches 12 in not limited thereto. For example, when two notches 12 are arranged, it is preferable that a pair of the notches 12 is symmetrically arranged on a radial direction of the nut 10. When three notches 12 are arranged, it is preferable to maintain angle of almost 120 degrees. Since a contact area between the screw shaft 2 and the nut 10 becomes smaller when plural notches 12 are arranged, it is possible to efficiently strip any adhered matters even when they are more firmly adhered to a portion between the screw shaft 2 and the nut 10.

Figure 3A:
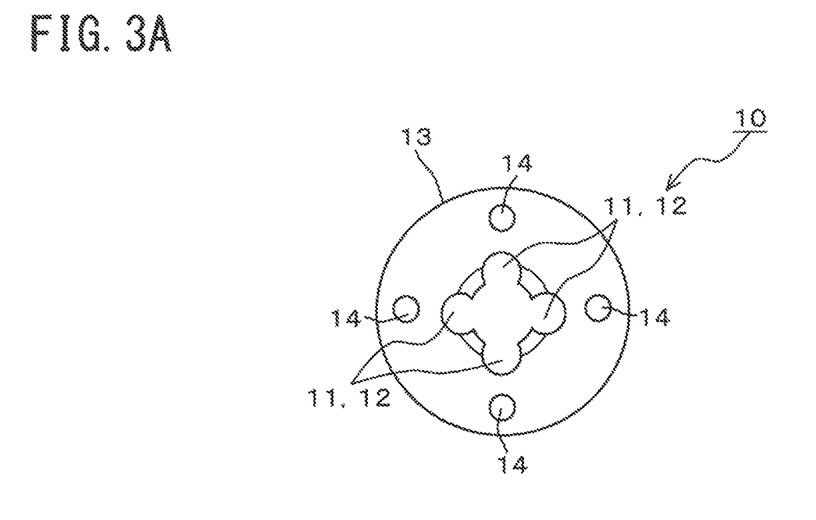
FIG. 3A is a plan view of the nut 10 for showing a variation example thereof.
Figure 3B:
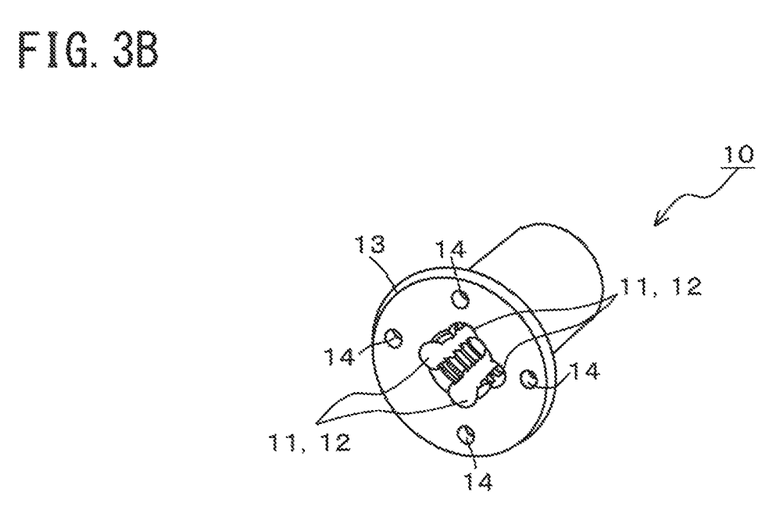
FIG. 3B is a perspective view of the nut 10 for showing the variation example thereof.

As shown in FIGS. 3A and 3B, when four notches 12 are arranged, it is preferable to maintain angle of almost 90 degrees and it is possible to efficiently strip any adhered matters, which will be described later, by four notches 12 even when they are more firmly adhered.

[Materials]

The nut 10 is made of metals such as brass or the like but may be made of stainless steel. When it is made of the stainless steel, it is very preferable that after processing, any nitriding is performed on a surface thereof by known means so that the surface becomes rigid and smooth. The same goes for the material of the nut, too, in the following. Although the nut 10 and the screw shaft 2 are trapezoidal screws in this embodiment, the invention is not limited thereto. For example, a triangle screw may be used.

[Manufacturing Method]

After the nut 10 has been provided with the screw threads by an already known method, the notch 12 is processed and formed in the nut 10 by an endmill or the like. After the hole has been pierced in the nut 10, burrs are removed. The notch 12 is formed so as to cut off the screw threads. The notch 12 is formed parallel to a movement direction against the screw shaft 2 along whole length (whole) of the nut 10 from a forward end thereof to a read end thereof.

Figure 4:
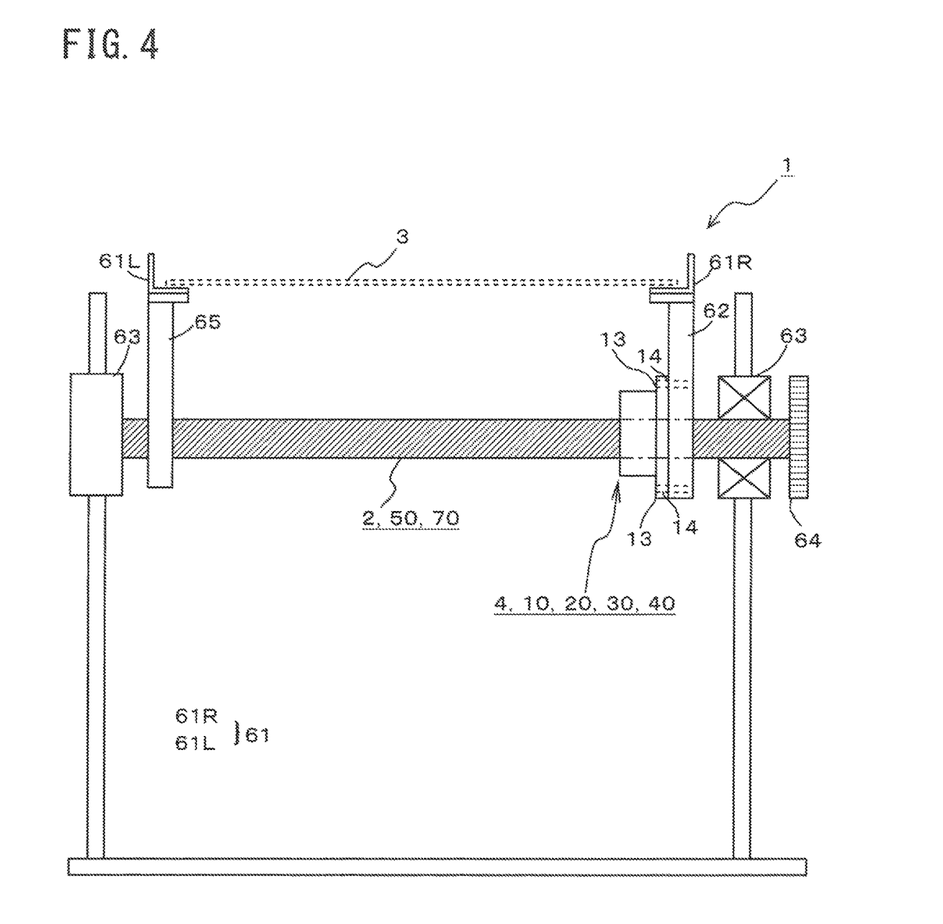
FIG. 4 is an outlined plan view of a soldering device 1 according to the invention for showing a configuration example thereof.
Figure 5A:
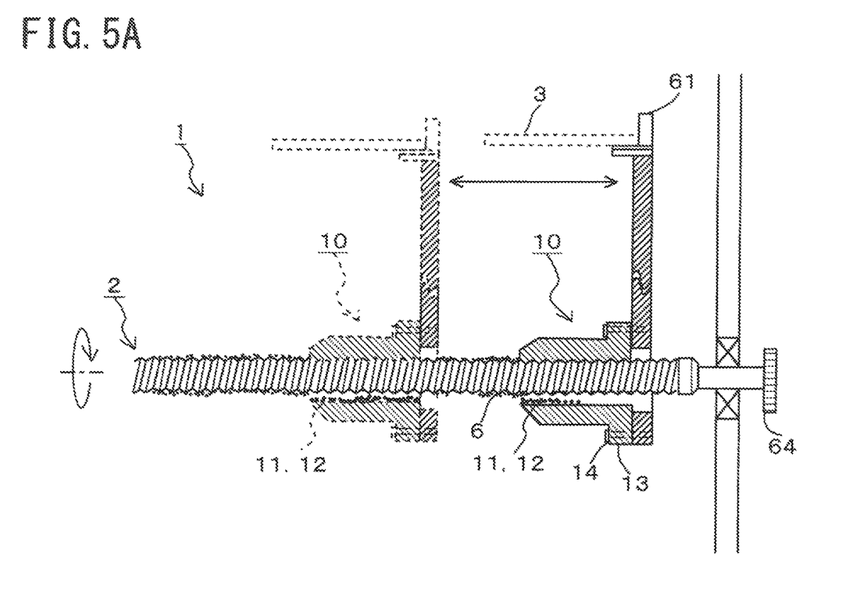
FIG. 5A is a cross-sectional view of the soldering device 1 for showing an adjustment example when the nut 10 is fitted to the soldering device 1.
Figure 5B:
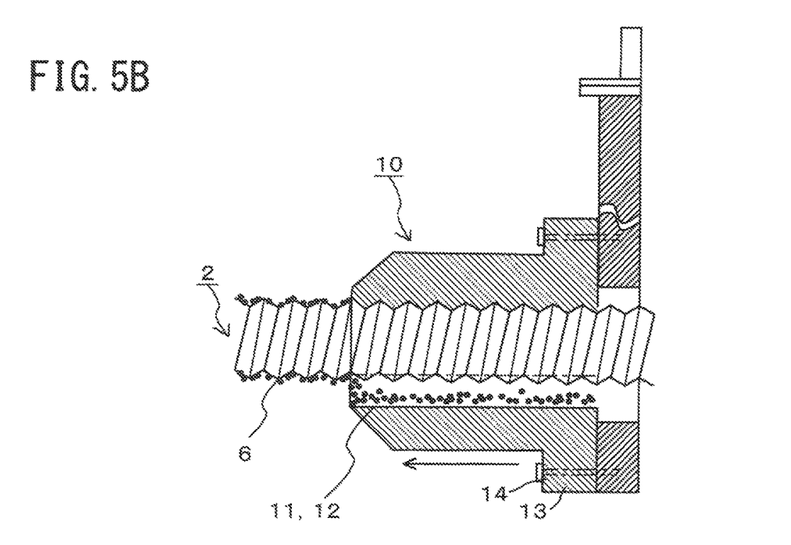
FIG. 5B is an enlarged cross-sectional view of the soldering device 1 for showing an adjustment example when the nut 10 is attached to the soldering device 1.

The following will describe an adjustment example of the soldering device 1 and the nut 10 according to the invention when the nut 10 is fitted to the soldering device 1 with reference to FIGS. 4 through 5B. As shown in FIG. 4, the soldering device 1 according to the invention is a device for soldering by heating and processing, for example, the printed circuit board 3 or the like in which solder paste is applied to predetermined electrodes. The soldering device 1 is provided with a pair of conveying rails 61 for conveying the printed circuit board 3 and an adjustment member for changing a width between the pair of the conveying rails 61L, 61R to match a size of the printed circuit board 3. In this embodiment, the conveying rail 61L is set to be a fixed rail and the conveying rail 61R is set to be a movable rail.

As the adjustment member for changing a width between the conveying rails 61L, 61R, the soldering device 1 is provided with the following. The conveying rail 61R is supported by a rail-supporting portion 62. The rail-supporting portion 62 is connected with the nut 10 through connection holes 14 thereof by the screws or the like. The nut 10 screws on to the screw shaft 2. The screw shaft 2 is rotatably supported at opposite ends by a pair of bearings 63 and is rotated by a rotation member 64. Through the rotation of the screw shaft 2, the nut 10 meshed therewith moves forward or backward along the screw shaft 2. Thus, the conveying rail 61R moves forward or backward along the screw shaft 2. The conveying rail 61L is supported by a rail-supporting portion 65 but since the rail-supporting portion 65 is configured not to mesh with the screw shaft 2 (which is not shown), the conveying rail 61L is fixed, not moved, at this position even when the screw shaft 2 rotates.

As described above, the screw shaft 2 and the nut 10 are used for allowing the conveying rail 61R to move so that a rail width matches the size of the printed circuit board 3. When the rotation member 64 rotates, the nut 10 moves forward or backward, so that a screwed position of the screw shaft 2 and the nut 10 alters, thereby allowing a fixed position of the nut 10 to the screw shaft 2 to alter. Thus, it is possible to change a width between the pair of the conveying rails 61L, 61R to match the size of the printed circuit board 3.

As shown in FIG. 5A, flux fumes and the like are adhered to at least any of screw threads and valleys of screw of the nut 10 and the screw shaft 2 due to a usage of the soldering device 1 for a long time. Such adhered matters are solidified in time so as to be fixed matters 6. When the nut 10 moves forward and backward, the fixed matters 6 are stripped and scrapped by mainly ridges of the notch 12 of the nut 10. The scrapped fixed matters 6 (scrapped filings) are scrapped down to the notch 12, which stops the prevention of the movement forward and backward of the nut 10 by adhering these scrapped filings to the nut 10 and the screw shaft 2 again.

Thus, when rotating the screw shaft 2 so that the nut 10 moves on the screw shaft 2, the notch 12 functions as if it removes the fixed matters 6 with them being scrapped. As shown in FIG. 5B, the fixed matters 6 scrapped by the notch 12 are collected in the notch 12 and dropped from a screw end or a screw head. Thus, it is relatively easily possible to change the fixed position of the nut 4 to the screw shaft 2.

As shown in FIG. 4, the soldering device 1 according to the invention may be provided with a nut 4, nuts 20, 30 or an attachment 40 for nut, which will be described later, other than the nut 10. The soldering device 1 may be also provided with a conventional screw shaft 2, screw shaft 50 or 70. When, however, this invention is applied to the soldering device 1 having the conventional screw shaft 2 and the conventional nut, it is possible to achieve this invention by connecting an attachment 40 for nut, which will be described later, to the conventional nut 4.

Accordingly, the nut 10 as the embodiment has a non-meshing part 11 composed of the notch 12 formed parallel to a movement direction of the nut 10 and screws on to the screw shaft 2. By such a configuration, it is possible to adjust the fixed position of the nut 10 to the screw shaft 2 easier than that of the conventional example. When the nut 10 is fitted to the soldering device 1, it is easily possible to change the fixed position of the nut 10 even if the fixed matters 6 occurs when each device is used for a long time.

The notch 12 functions as if it scraps the fixed matters 6 to remove them merely by rotating the nut 10 to move on the screw shaft 2 even if there are the fixed matters 6 in the screw shaft 2 when the soldering device 1 is used for a long time in a case where the nut 10 is fitted to the soldering device 1. Accordingly, it is characterized in that the solidified flux fumes which has been adhered to members (the screw shaft 2 and the nut 10) for realizing the rail width so as to match the size of board can be easily removed, thereby allowing the fixed position of the nut 10 to be easily changed.

Second Embodiment

Figure 6A:
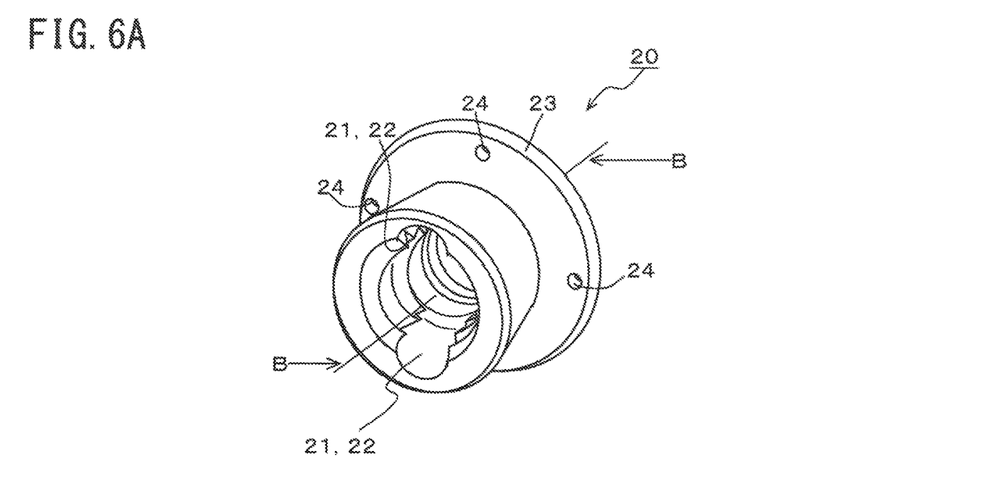
FIG. 6A is a perspective view of a nut 20 for showing a configuration example thereof as a second embodiment according to the invention.
Figure 6B:
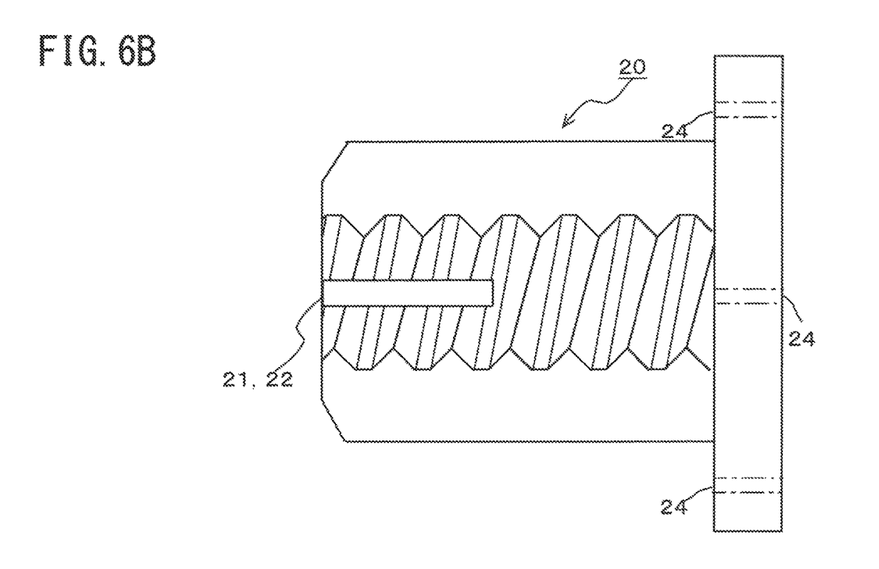
FIG. 6B is a cross-sectional view of the nut 20, taken along lines B-B.

The following will describe a configuration example of the nut 20 as the embodiment with reference to FIGS. 6A and 6B.

The nut 20 screws on to the screw shaft 2 having a predetermined length (see FIG. 4) and is able to change the fixed position of the nut 20 to the screw shaft 2. The nut 20 includes two non-meshing parts 21 which do not mesh with the screw shaft 2 and a flange portion 23 for connecting another member at a screw head of the nut 20. The flange portion 23 contains connecting holes 24 for allowing it to be connected to another member by screws or the like.

The non-meshing part 21 is composed of notches 22 that are formed by cutting off the screw threads of the nut 20 in an arc-like shape for every 180 degrees. Each of the notches 22 are arranged parallel to a movement direction of the nut 20 to the screw shaft 2 to extend from a screw end of the nut 20 across at least three screw threads. A number of the screw threads to be cut off may have a sufficient length to strip the fixed matters 6 (see FIGS. 5A and 5B) fixed to the screw shaft 2 and the number of the screw threads is not limited.

A shape of each of the notches 22 is not limited to an arc-like shape. It is preferable that a cut depth of each of the notches is deeper than the valley of screw in the nut 20. A width of each of the notches 22 is not limited but it is preferable that the width includes about three through five screw threads.

The notches 22 are not limited to two but may be at least one. For example, in a case of two notches 22, it is preferable that a pair of the notches is symmetrically provided in the nut 20 in a radial direction thereof. A length of each of the notches 22 is not limited to a length of three screw threads but may be a length of at least one screw thread. It is preferable in this case that the notches 22 are provided at a side of the screw end of the nut 20.

[Materials]

The nut 20 is made of metals such as brass or the like. Although the nut 20 is a trapezoidal screw in this embodiment, the invention is not limited thereto. For example, a triangle screw may be used.

[Manufacturing Method]

The manufacturing method of the nut 20 is similar to that of the nut 10. The notches 22 are formed parallel to a movement direction thereof to the screw shaft to extend from a screw end of the nut 20 across at least three screw threads.

The nut 20 is fitted to the soldering device shown in FIG. 4 and operates similar to the nut 10 of the first embodiment shown in FIGS. 5A and 5B. In this moment, even when the flux fumes or the like are fixed to the screw shaft, the notches 22 function as if they remove the fixed matters merely by rotating the nut 20 to move on the screw shaft 2. Accordingly, it is characterized in that the flux fumes adhered to and solidified in the members (the screw shaft 2 and the nut 20) for changing the rail width so as to match the size of board can be easily removed, thereby allowing the fixed position of the nut 20 to be easily changed.

Since the nut 20 has shorter notches 22 than that of the nut 10 of the first embodiment, it is possible to reduce burden when the notches 22 are formed by the endmill or the like.

Third Embodiment

Figure 7A:
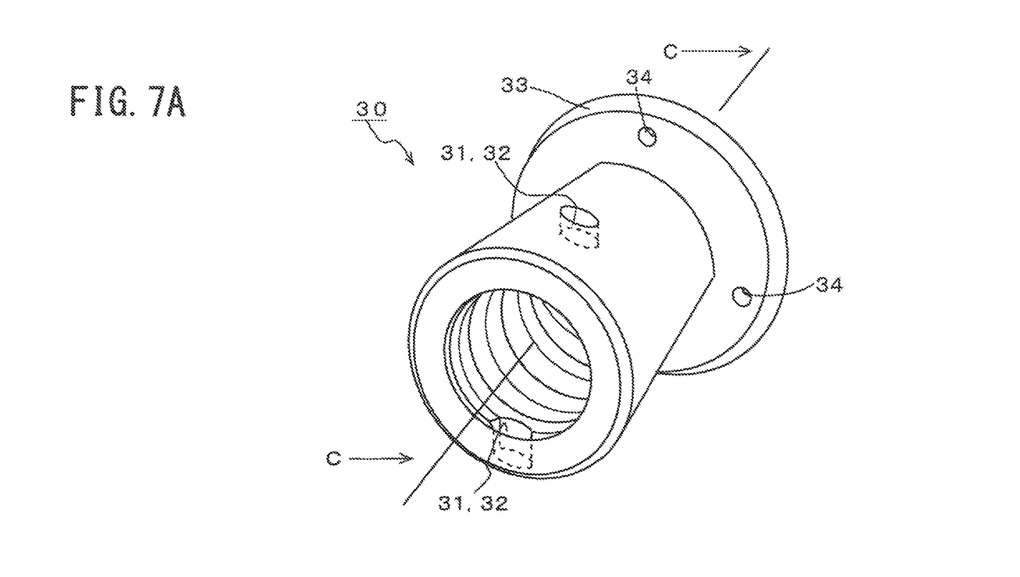
FIG. 7A is a perspective view of a nut 30 for showing a configuration example thereof as a third embodiment according to the invention.
Figure 7B:
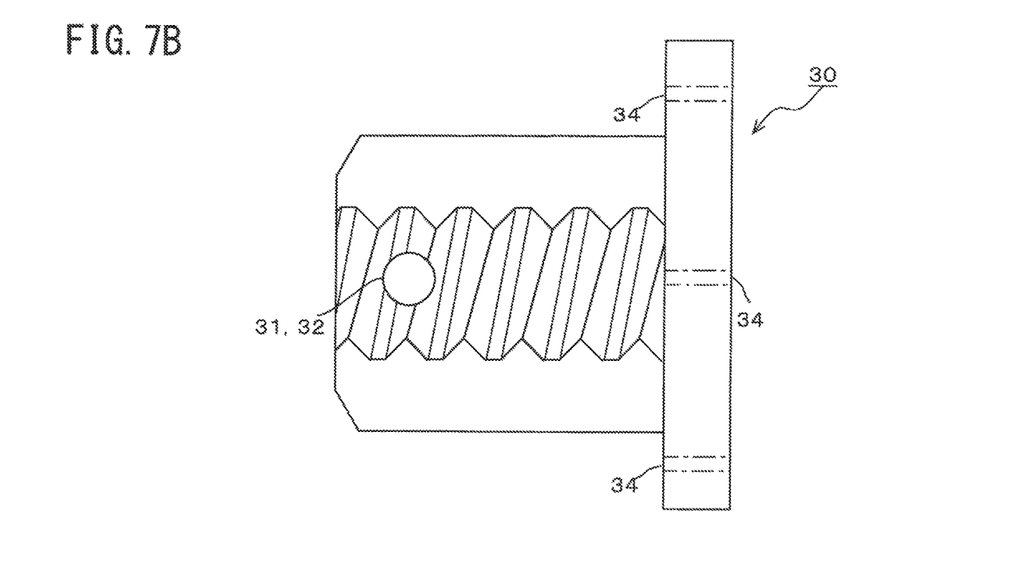
FIG. 7B is a cross-sectional view of the nut 30, taken along lines C-C.

The following will describe a configuration example of the nut 30 as the embodiment with reference to FIGS. 7A and 7B. The nut 30 screws on to the screw shaft 2 having a predetermined length (see FIG. 4) and is able to change the fixed position of the nut 30 to the screw shaft 2. The nut 30 includes two non-meshing parts 31 which do not mesh with the screw shaft 2 and a flange portion 33 for connecting another member at a screw head of the nut 30. The flange portion 33 contains connecting holes 34 for allowing it to be connected to another member by screws or the like.

The non-meshing parts 31 include the notches 32 formed by piecing circular holes on the screw thread. The notches 32 are formed on a radial direction of the nut 30.

Two notches 32 are symmetrically arranged on a radial direction of the nut 30. The notches 32 preferably pass through the nut 30 but the depth thereof may be a sufficient depth to strip off the fixed matters 6 (see FIGS. 5A and 5B) fixed to the screw shaft 2. A shape of each of the notches 32 is not limited to a circle. A size thereof does not matter.

A number of the notches 32 is not limited to two. For example, in a case of two notches 32, it is preferable that a pair of the notches 32 is symmetrically provided in the nut 30 in a radial direction thereof. It is preferable that the notches 32 are arranged at shifted positions along the movement direction of the nut 30. It, however, is preferable that the notches 32 are provided near a screw end of the nut 30.

[Materials]

The nut 30 is made of metals such as brass or the like. Although the nut 30 is a trapezoidal screw in this embodiment, the invention is not limited thereto. For example, a triangle screw may be used.

[Manufacturing Method]

After the nut 30 has been provided with the screw threads by an already known method, the notches 32 are formed in the nut 30 by piecing the holes by means of a drill or the like on a radial direction thereof. The notches 32 are formed to cut off the screw thread of the nut 30. After the holes have been pieced by the drill or the like, burrs are removed.

The nut 30 is fitted to the soldering device 1 according to the invention shown in FIG. 4 and can perform an operation similar to that of the nut 10 of the first embodiment. The explanation thereof will be omitted because the operation thereof has been described.

Accordingly, the nut 30 as the embodiment has the non-meshing parts 31 composed of the notches 32 formed on the radial direction of the nut 30 and screws on to the screw shaft 2. By such a configuration, it is possible to adjust the fixed position of the nut 30 to the screw shaft 2 easier than that of the conventional example.

When the nut 30 is fitted to the soldering device 1 shown in FIGS. 4, 5A and 5B, the notches 32 function as if they scrap the adhered matters to remove them merely by rotating the nut 30 to move on the screw shaft 2 even if there are the fixed matters 6 in the screw shaft 2 in a case of generating the fixed matters 6 when the soldering device 1 is used for long time. Accordingly, it is characterized in that the solidified flux fumes adhered to the members (the screw shaft 2 and the nut 10) for changing the rail width to match the size of board can be easily removed, thereby allowing the fixed position of the nut 30 to be easily changed.

Fourth Embodiment

Figure 8A:
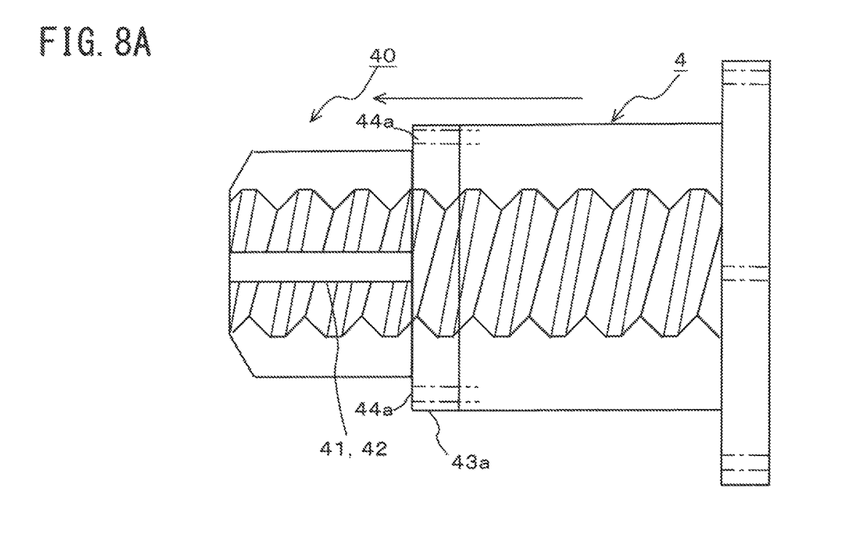
FIG. 8A is a cross-sectional view for showing an example in which an attachment 40 for nut as a fourth embodiment screws on to a screw end of a nut 4.
Figure 8B:
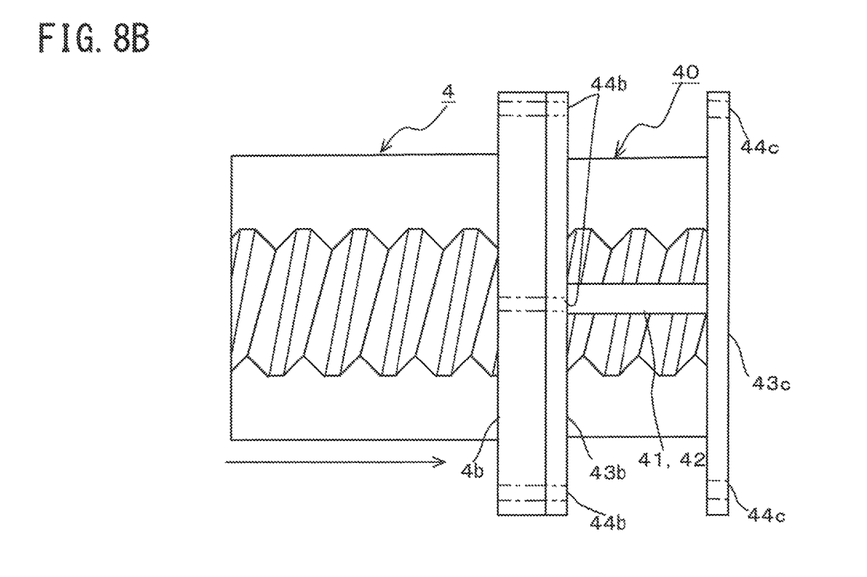
FIG. 8B is a cross-sectional view for showing an example in which an attachment 40 for nut as a fourth embodiment screws on to a screw head of the nut 4.

The following will describe a configuration example of the attachment 40 for nut as the embodiment with reference to FIGS. 8A and 8B. The attachment 40 for nut can be fitted to a conventional nut 4 and screws on to the screw shaft 2 having a predetermined length (see FIG. 4). Together with the nut 4, the attachment 40 for nut can change their fixed positions to the screw shaft 2.

The attachment 40 for nut includes one non-meshing part 41 which does not mesh with the screw shaft 2. The non-meshing part 41 includes a notch 42 that is formed by cutting off the screw threads in an arc-like shape. The notch 42 is formed parallel to a movement direction of the attachment 40 for nut.

A number of the notch 44 is not limited to one. For example, in a case of two notches 42, it is preferable that a pair of the notches 42 is symmetrically arranged on a radial direction of the attachment 40 for nut. A shape of the notch 42 is not limited to an arc-like shape. It is preferable that a cut depth of the notch is deeper than the screw valley in the attachment 40 for nut.

The attachment 40 for nut is connected by screws, not shown, or the like on a movement direction of the nut 4. FIG. 8A shows that the attachment 40 for nut is fitted when the nut 4 is moved along an arrow direction shown in this drawing. The attachment 40 for nut connects the nut 4 so that a flange portion 43a of the attachment 40 for nut and the nut 4 are connected by screws or the like, so as to be continuous with screw threads and screw valleys of the nut 4. The flange portion 43a has connection holes 44a and holes for connecting these holes are pieced in the nut 4.

FIG. 8B shows that the attachment 40 for nut is fitted when the nut 4 is moved along an arrow direction shown in this drawing. The attachment 40 for nut is connected by screws or the like so that screw threads and screw valleys thereof are continuous with them of the nut 4. The attachment 40 for nut is provided with a flange portion 43b, at an end thereof, for connecting the flange portion 4b of the nut 4. The flange portion 43b includes connection holes 44b. The attachment 40 for nut is provided with a flange portion 43c, at other end, for connecting another member by screws or the like. The flange portion 43c includes connection holes 44c. Although the attachment 40 for nut has been connected to only one end of the nut 4 in this embodiment, the attachment 40 for nut may be connected to both ends of the nut 4.

[Materials]

The attachment 40 for nut is made of metals such as brass or the like. Although the nut 4 and the attachment 40 for nut are trapezoidal screws in this embodiment, the invention is not limited thereto. For example, triangle screws may be used.

[Manufacturing Method]

After the attachment 40 for nut has been provided with the screw threads by an already known method so that they are continuous to the nut 4, the notch 42 is formed parallel to the movement direction of the attachment 40 for nut by piecing the holes by means of an endmill or the like. The connection holes 44a, 44b, 44c are pieced by a drill or the like. The notch 42 is formed to cut off the screw threads of the nut attachment 40 for nut. After the holes have been pieced in the attachment 40 for nut by the endmill or the like, burrs are removed, so that the notch 42 is completed.

Although the notch 42 of the attachment 40 for nut is arranged to extend at a whole length (whole) from a forward end of the attachment 40 for nut to a rear end thereof, this invention is not limited thereto. The notch 42 may be arranged to have a length by one screw thread along the movement direction thereof. The notch 42 may be arranged on a radial direction of the attachment 40 for nut like the non-meshing parts 31 of the third embodiment.

Although the attachment 40 for nut has been provided with the non-meshing part 41 including the notch 42, this invention is not limited thereto. The attachment 40 for nut may be provided with a projection portion, not shown, which projects to mesh with the screw shaft, at only a part of a circuit of the screw tread, not provided with the screw thread on whole thereof. It is preferable that this projection is arranged at least one position thereof. When plural projections are arranged in the attachment 40 for nut, it is preferable that they are shifted to each other along a movement direction and when they are arranged on one circle of the screw thread, it is more preferable to arrange them so as to be symmetrically arranged on a radial direction thereof.

Accordingly, the attachment 40 for nut as the embodiment has the non-meshing part 41 composed of the notch 42 formed parallel to the movement direction of the attachment 40 for nut. The attachment 40 for nut is connected to the conventional nut 4 to screw on to the screw shaft 2 together with the nut 4. By such a configuration, it is possible to adjust the fixed position of the nut 4 and the attachment 40 for nut to the screw shaft 2 easier than that of the conventional example.

The nut 4 and the attachment 40 for nut are fitted on, for example, the members for changing the rail width in the soldering device 1 shown in FIG. 4. The attachment 40 for nut can perform the same operations as those of the nut 10 indicated by the first embodiment.

The notch 42 functions as if it scraps the adhered matters to remove them merely by rotating the nut 4 and the attachment 40 for nut to move on the screw shaft 2 even when the fixed matters 6 (see FIGS. 5a and 5B) occur in the screw shaft 2. For example, when they are fitted to the soldering device 1, it is characterized in that the solidified flux fumes adhered to the members for changing the rail width to match the size of board can be easily removed, thereby allowing the fixed position of the nut 4 and the attachment 40 for nut to be easily changed.

Fifth and Sixth Embodiment

Figure 9A:
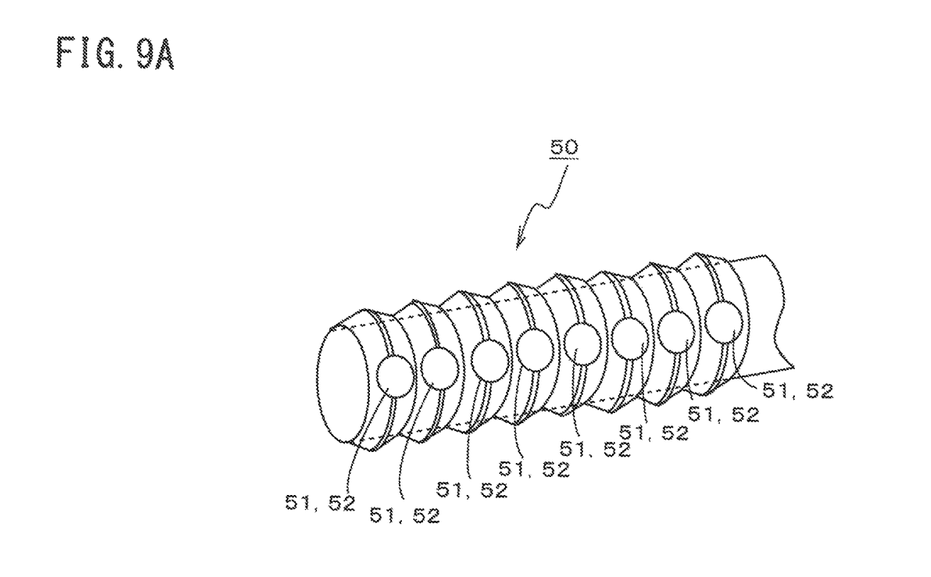
FIG. 9A is a perspective view of a screw shaft 50 for showing a configuration example thereof as a fifth embodiment according to the invention.
Figure 9B:
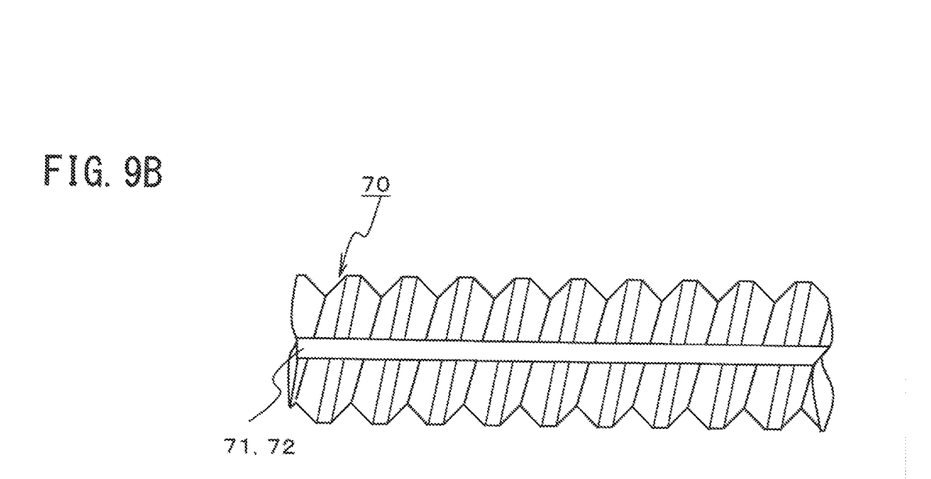
FIG. 9B is a side view of a screw shaft 70 for showing a configuration example thereof as a sixth embodiment according to the invention.

The following will describe screw shafts 50 and 70 as embodiments with reference to FIGS. 9A and 9B. A nut, not shown, having a predetermined length screws on to the screw shaft 50 or 70 so that they have a predetermined length.

In FIG. 9A showing the fifth embodiment, the screw shaft 50 includes non-meshing parts 51 which do not mesh with the nut. Each of the non-meshing parts 51 is composed of the notched groove 52 formed by cutting off the screw thread in an arc-like shape. The notched grooves 52 are formed in a row, in this embodiment, along a movement direction of the nut 4 (see FIG. 4).

The notched grooves 52 are wholly arranged parallel to a longitudinal direction of the screw shaft 50 from an end to the other end of the screw shaft 50. A shape of each of the notched grooves 52 is not limited to an arc-like shape. A cut depth and a width thereof are do not matter.

The notched grooves 52 are not limited to one-rowed grooves. It is preferable that at least one notched groove 52 is provided on a single screw thread, but they may be arranged on only a part of the screw shaft 50, not whole thereof, for allowing a fixed position of the nut to be changed. For example, when two notched grooves 52 are arranged on the single screw thread, it is preferable that a pair of the notched grooves 52 is symmetrically arranged on the screw shaft 50 in a radial direction thereof.

[Materials]

The conventional screw shaft may be used as it is as the screw shaft 50 which is preferably made of steel or the like. Particularly, it is preferable that the screw shaft is made of stainless steel. It is very preferable that when using the stainless steel, any nitriding is performed on a surface thereof by known means after processing so that the surface becomes rigid and smooth. Although the screw shaft 50 is a trapezoidal screw in this embodiment, the invention is not limited thereto.

In FIG. 9B showing the sixth embodiment, the screw shaft 70 includes a lined non-meshing part 71 which does not mesh with the nut. The non-meshing part 71 is composed of a notched groove 72 formed parallel to the screw shaft 70 by cutting off the screw threads in a linear manner in a line, in this embodiment, along a movement direction of the nut 4 (see FIG. 4).

The notched groove 72 is not limited to one lined one. The notched groove 72 may be arranged on the screw shaft 70 partially, not wholly. Further, it is not limited to the one formed parallel to the screw shaft 70 by cutting off the screw threads in a linear manner. For example, the notched groove 72 may be arranged on the screw shaft 70 spirally.

Accordingly, the screw shaft 50 or 70 as the embodiment has the non-meshing part 51 or 71 composed of the notched groove 51 or 72 formed parallel to the longitudinal direction of the screw shaft 50 or 70. The screw shaft 50 or 70 screws on to the nut 4 (see FIG. 4), the nut 10 (see FIGS. 1A and 1B), or the conventional nut 4 connected to the attachment 40 (see FIGS. 8A and 8B) for nut. By such a configuration, it is possible for the screw shaft 50 or 70 to adjust the fixed position of the nut 30 or the like to the screw shaft 50 or 70 easier than that of the conventional example.

The screw shaft 50 or 70 is fitted to, for example, the soldering device 1 shown in FIG. 4 as a member for changing a rail width therein. In this moment, the notched groove 52 or 72 functions as if it scraps the adhered matters to remove them merely by rotating the nut 4 to move on the screw shaft 50 or 70 even when the fixed matters 6 occur in the screw shaft 50 or 70 (see FIGS. 5A and 5B). Accordingly, the flux fixed to the members (the screw shaft 50 or 70 and the nut 4) for changing the rail width to match the size of board can be easily removed.

INDUSTRIAL APPLICABILITY

Since the adhered matters can be stripped by the operation of the non-meshing part even if the adhered matters is fixed to the screw shaft, this invention is applicable to a case where the adhered matters is fixed to at least any of the nut and the screw shaft. For example, it is very preferable that the invention is applied to a soldering device to which flux fumes are fixed or a coating material coating device to which a coating material is fixed.

EXPLANATION OF CODES

1: Soldering Device
2, 50, 70: Screw Shaft
10, 20, 30: Nut
11, 21, 31, 41, 51, 71: Non-meshing part(s)
12, 22, 32, 42: Notch(es)
13, 43a, 43b, 43c: Flange Portion
14, 44a, 44b, 44c: Connection Hole(s)
40: Attachment for Nut
52, 72: Notched Groove
61L, 61R: Conveying Rail
62, 65: Rail-supporting Portion
63: Bearings
64: Rotation Member

The invention claimed is:

1. A soldering device comprising:
an adjustment member for changing a width between conveying rails to match a size of a conveying substrate to be soldered,
wherein the adjustment member includes:
a screw shaft that rotates;
a nut having a flange portion for connection, a fixed position of the nut to the screw shaft being changeable forward or backward by rotating the screw shaft; and
a rail-supporting member for supporting a rail which conveys the substrate, the rail-supporting member being fixed to the nut through the flange portion for connection and changing the width between the conveying rails to match the size of the conveying substrate,
wherein the nut contains a screw portion from a forward end thereof to a rear end thereof and includes at least one non-meshing part along whole thereof, the non-meshing part does not mesh with the screw shaft, and
wherein when changing the width between the rails for conveying the substrate by rotating the screw shaft, an adhered matter which is adhered to the screw shaft and is fixed thereto is scrapped by a ridge of the non-meshing part due to the rotation of the screw shaft.

* * * * *